United States Patent
Ohminami

(10) Patent No.: US 6,975,102 B2
(45) Date of Patent: Dec. 13, 2005

(54) APPARATUS AND METHOD FOR ANALYZING CAPACITANCE OF INSULATOR

(75) Inventor: Nobuyuki Ohminami, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 190 days.

(21) Appl. No.: 10/003,258

(22) Filed: Dec. 6, 2001

(65) Prior Publication Data

US 2002/0070731 A1 Jun. 13, 2002

(30) Foreign Application Priority Data

Dec. 12, 2000 (JP) ........................................ 2000-378188

(51) Int. Cl.⁷ .................. G01R 31/02; G01R 31/26; G01N 27/00
(52) U.S. Cl. .................... 324/73.1; 324/765; 324/71.6
(58) Field of Search .............. 324/71.1, 71.5, 324/500, 71.6, 765, 73.1, 719, 754; 438/14, 17; 257/754, 204

(56) References Cited

U.S. PATENT DOCUMENTS

| | | | | |
|---|---|---|---|---|
| 3,646,527 A | * | 2/1972 | Wada et al. .................. 365/184 |
| 4,510,516 A | * | 4/1985 | Bartelink ..................... 257/296 |
| 5,119,155 A | * | 6/1992 | Hieda et al. ................. 257/304 |
| 5,233,291 A | * | 8/1993 | Kouno et al. ............... 324/765 |
| 5,266,892 A | * | 11/1993 | Kimura ....................... 324/767 |
| 5,360,989 A | * | 11/1994 | Endo ............................ 257/532 |
| 5,362,975 A | * | 11/1994 | Von Windheim et al. ..... 257/76 |
| 5,444,389 A | * | 8/1995 | Hirae et al. .................. 324/765 |
| 5,475,319 A | * | 12/1995 | Hirae et al. .................. 324/765 |
| 5,521,525 A | * | 5/1996 | Nicollian et al. ............ 324/765 |
| 5,554,939 A | * | 9/1996 | Hirae et al. .................. 324/753 |
| 5,568,252 A | * | 10/1996 | Kusuda et al. ................. 356/72 |
| 5,701,088 A | * | 12/1997 | Fujimaki ..................... 324/765 |
| 6,037,781 A | * | 3/2000 | Kono et al. .................. 324/537 |
| 6,472,233 B1 | * | 10/2002 | Ahmed et al. ................. 438/14 |

FOREIGN PATENT DOCUMENTS

| | | | | |
|---|---|---|---|---|
| JP | 06-112289 | * | 4/1994 | ........... H01L/21/66 |
| JP | 6-112291 |   | 4/1994 | |
| JP | 2709351 |   | 10/1997 | |
| JP | 11-150246 | * | 6/1999 | ......... H01L/27/108 |

OTHER PUBLICATIONS

Phisics 3 Spring 1989; Lab 1; Capacitance Measurements.*
Japanese Office Action dated Jan. 21, 2005 (w/out English translation thereof).
Abstract; Motohiro et al; "C–V Charatcteristic Conversion Method in Contractless C–V Measuring Device"; JP 06–112289; Apr. 22, 1994.

* cited by examiner

*Primary Examiner*—Andrew H. Hirshfeld
*Assistant Examiner*—Wasseem H. Hamdan
(74) *Attorney, Agent, or Firm*—Nixon & Vanderhye P.C.

(57) ABSTRACT

According to the present invention, there is provided an insulator capacitance analyzer for analyzing C-V characteristics of a first MIS structure having unknown capacitance, which includes: a capacitance structure having known capacitance and configured so as to be serially connectable to the first MIS structure; and a measuring section for measuring synthesis capacitance of the serially-connected first MIS structure and capacitance structure.

2 Claims, 9 Drawing Sheets

FIG. 6 PMOS C-V Characteristics

Active Area: 9E-4cm²
w/o Well Imp.
Gate SiON: NO/N₂ poly Si: 200nm
P+Imp.: BF₂

APPARATUS AND METHOD FOR ANALYZING CAPACITANCE OF INSULATOR

BACKGROUND OF THE INVENTION

1. Field of the Invention

The present invention relates to an apparatus and method for analyzing C-V (Capacitance-Voltage) characteristics of a MIS (Metal/Insulator/Semiconductor) structure, and more particularly to an apparatus and method capable of analyzing C-V characteristics of a MIS structure which includes a thin silicon oxide film having a thickness of less than 3 nm.

2. Description of the Related Art

It is time consuming and troublesome to practically produce a transistor for the purpose of analyzing a gate insulator of the transistor. Accordingly, it would be advantageous if transistor characteristics, such as a drive current value, can be presumed without producing a transistor so as to determine these characteristics. A known method for presuming transistor characteristics without producing a transistor is to produce a MIS (Metal/Insulator/ Semiconductor) structure and analyze C-V (Capacitance-Voltage) characteristics thereof by directly measuring capacitance of the MIS structure.

In recent years, dual gate (P+ gate and N+ gate) structures are coming into use as transistor gates. In a transistor having a dual gate structure, a boron ion injected into a P+ gate electrode is diffused to a channel section by heat treatment performed in a subsequent process, so that a threshold voltage of the transistor is changed.

FIG. 6 is a graph illustrating punch-through of a boron ion in a P+ gate electrode caused by heat treatment after the formation of a MIS structure. In the example shown in FIG. 6, a P-type MIS structure having a size of $9 \times 10^{-4}$ cm$^2$ is formed and its C-V characteristics are analyzed at various heat treatment temperatures. From FIG. 6, it is appreciated that at 1010° C. and 1020° C., respective C-V curves overlap each other and punch-through of a boron ion does not occur, and thus heat treatment at 1010° C. and 1020° C. is preferable. It is also appreciated that at 1050° C., the C-V curve is shifted to a positive potential side, which indicates that a boron ion is diffused to the substrate, and thus heat treatment at 1050° C. is not preferable. If the data shown in FIG. 6 is obtained before the production of the transistor, a transistor production process can be designed such that a heat treatment is performed at 1020° C. or lower. The measurement of C-V characteristics is becoming more important as a simple and efficient technique for analyzing whether or not punch-through of a boron ion occurs at a P+ gate electrode.

A known method for analyzing capacitance of an insulator is to experimentally form a MIS structure on a silicon substrate (a wafer or chip) as a test element group (TEG) and analyze C-V characteristics of the MIS structure using a measuring device (an LCR meter).

As LSI circuits are highly integrated, and by a demand for speedup of devices, the size of a device such as a transistor is becoming very small not only in its area but also in its thickness. In particular, a gate silicon oxide film is required to be 3 nm or lower in thickness. The C-V characteristics of such a very thin insulator cannot be accurately analyzed using conventional measuring devices in which unknown capacitance is directly measured.

FIG. 7 is a graph illustrating I-V characteristics of an N-type MOS (Metal/Oxide/Semiconductor) structure which includes as an insulator a silicon oxide film having a thickness of between about 1.5 nm and about 3.2 nm. As can be seen from FIG. 7, in the case of using such a silicon oxide film, when the thickness is 3 nm or more, F-N tunnel leakage current is dominant, and thus leakage current is very small. When the thickness is less than 3 nm, direct tunnel leakage current is dominant and leakage current is very large.

FIG. 8 is a graph illustrating C-V characteristics of an N-type MOS structure analyzed using a conventional C-V measuring device. As can be seen from FIG. 8, when an insulator has a thickness of about 3.2 nm, a measured C-V curve 71 indicates normal characteristics, but when the insulator has a thickness of about 2 nm, a measured C-V curve 73 deviates from an ideal curve 72 at a voltage of −1.5 V or lower. This is caused by the direct tunnel leakage current flowing through the insulator.

In a device including an extremely thin insulator, the speedup of the device can be achieved. However, an increase in leakage current causes problems. Thus, the thickness of the insulator is selected according to the purposes of the device. In other words, when it is desirable to decrease any consumption current by reducing leakage current, the device having a very thin insulator is not used. When the requirement for speedup of the device exceeds decrease in power consumption (current), a device having an insulator which is thinner than about 3 nm is used.

Another known method for analyzing capacitance of an insulator uses a non-contact-type C-V measuring device disclosed in Japanese Laid-Open Publication No. 6-112289.

FIG. 9 is an equivalent circuit diagram for schematically explaining insulator capacitance measured using the non-contact-type C-V measuring device disclosed in Japanese Laid-Open Publication No. 6-112289. In FIG. 9, $\Phi_{ms}$ is a difference in work function of electrodes of the measuring device; $C_{air}$ is spatial (air-gap) capacitance; $C_{ox}$ is insulator capacitance; and $C_d$ is depletion-layer capacitance. $C_{air}$ refers to capacitance in a space between an electrode provided in the measuring device and an insulator. By providing the electrode in the measuring device and the space between the electrode and the insulator, capacitance of the insulator can be measured immediately after the formation of the insulator without forming a MIS structure. Moreover, by providing a silicon wafer and the electrode which are out of contact with each other, the silicon wafer does not suffer contamination from the metal electrode. Thus, a subsequent step can be uninterruptedly performed on the silicon wafer after the capacitance measurement.

When the insulator capacitance is measured using the conventional measuring device illustrated in FIG. 9, it is required to accurately calculate capacitance in the space between the electrode and the insulator. In order to accurately calculate the capacitance in the space between the electrode and the insulator when the insulator has a thickness of 3 nm or less, it is required to precisely control the distances between the electrode and the insulator on the order of 0.01 nm. However, it is presently physically impossible to perform control on such an order. There arises an error in the capacitance in space between the electrode and the insulator. The difference prevents the accurate recognition of the insulator capacitance. Moreover, in the conventional technique, the distances between the electrode and the insulator are limited by dust existing in the measuring process. This is because the measuring device is damaged when dust causes a short circuit between the electrode and the insulator. It is difficult to place the electrode and the insulator as close to each other as a distance of 100 nm or less. Moreover, in the conventional technique, the capacitance measurement can only be performed immediately after the formation of the insulator, and it is impossible to perform the capacitance measurement after the formation of the electrode. Accordingly, it is impossible to analyze the boron ion punching-through from the P+ gate electrode as shown in FIG. 6.

SUMMARY OF THE INVENTION

According to one aspect of the present invention, there is provided an insulator capacitance analyzer for analyzing C-V characteristics of a first MIS structure having unknown capacitance, which includes: a capacitance structure having known capacitance and configured so as to be serially connectable to the first MIS structure; and a measuring section for measuring synthesis capacitance of the serially-connected first MIS structure and capacitance structure.

In one embodiment of the invention, the capacitance structure may include at least one of a second MIS structure, a dielectric, and a capacitor.

In another embodiment of the invention, the capacitance structure may be configured so as to be removable from the insulator capacitance analyzer.

In still another embodiment of the invention, the insulator capacitance analyzer further includes: a plurality of capacitance structures each having known capacitance and configured so as to be serially connectable to the first MOS structure; and a switch for selecting one of the plurality of capacitance structures as the capacitance structure.

In still another embodiment of the invention, the equivalent silicon oxide thickness of the capacitance of the capacitance structure may be 3 nm or more.

In still another embodiment of the invention, the capacitance structure may be configured so as to prevent direct tunnel leakage current from flowing through the capacitance structure.

According to another aspect of the present invention, there is provided an insulator capacitance analysis method for analyzing C-V characteristics of a first MIS structure having unknown capacitance, which includes the steps of: serially connecting the first MIS structure to a capacitance structure having known capacitance; measuring synthesis capacitance of the serially-connected first MIS structure and capacitance structure; and calculating capacitance of the first MIS structure based on the synthesis capacitance.

Hereinafter, functions of the present invention are described.

According to the present invention, in a MIS structure to be measured having unknown capacitance ($C_2$) which is serially connected to a capacitance structure having known capacitance ($C_1$), synthesis capacitance (C) of the unknown capacitance $C_2$ and the known capacitance $C_1$ is measured. Even when an insulator of the MIS structure is thin, so that direct tunnel leakage current flows through the MIS structure, excessive leakage current can be prevented from flowing through an insulator capacitance analyzer so long as the capacitance structure is structured such that the direct tunnel leakage current cannot flow therethrough (i.e., the capacitance structure is dominated by F-N tunnel leakage current). Therefore, the synthesis capacitance (C) can be accurately measured.

The unknown capacitance ($C_2$) can be calculated by the following Expression (1).

$$1/C = 1/C_1 + 1/C_2 \qquad (1)$$

A value of a voltage applied to the serially-connected MIS structure and capacitance structure is changed so as to calculate capacitance $C_2$ at each voltage value, and thus C-V characteristics of an insulator included in the MIS structure can be accurately measured.

After electrodes are formed on the insulator, the MIS structure is connected to the capacitance structure, and thus it is possible to analyze effects on capacitance caused by boron ions punching-through the P+ electrode in the MIS structure having an extremely thin insulator.

Thus, the invention described herein makes possible the advantages of providing an apparatus and method for analyzing insulator capacitance which can accurately measure C-V characteristics of an extremely thin insulator without being affected by direct tunnel leakage current and can analyze boron ions punching-through a P+ electrode in a MIS structure having extremely thin film structure.

These and other advantages of the present invention will become apparent to those skilled in the art upon reading and understanding the following detailed description with reference to the accompanying figures.

DESCRIPTION OF THE PREFERRED EMBODIMENTS

Hereinafter, examples of the present invention are described with reference to the accompanying drawings.

EXAMPLE 1

Figure 1:
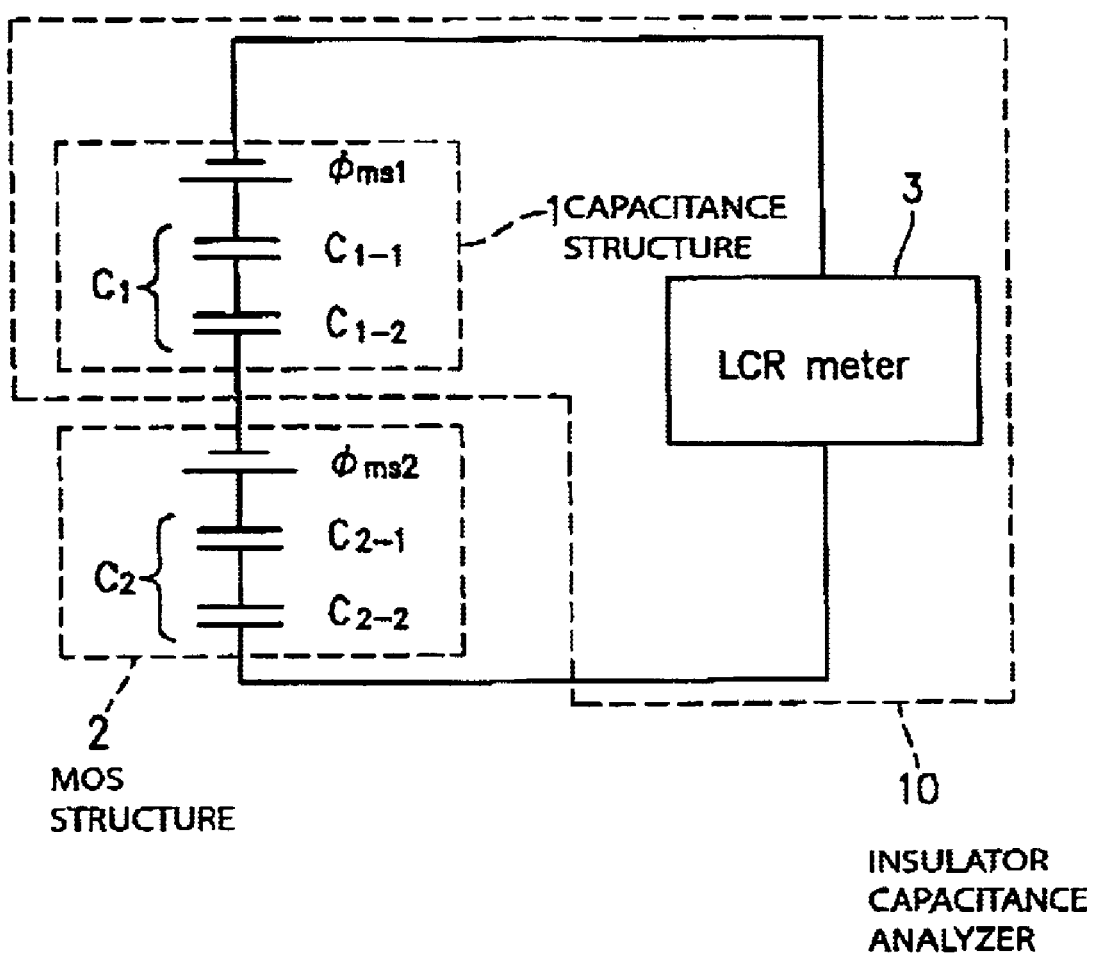
FIG. 1 illustrates a schematic structure of an insulator capacitance analyzer 10 according to Example 1 of the present invention.

FIG. 1 illustrates a schematic structure of an insulator capacitance analyzer 10 according to Example 1 of the present invention. The insulator capacitance analyzer 10 includes a capacitance structure 1 having known capacitance $C_1$ and a measuring section 3. The insulator capacitance analyzer 10 analyzes C-V characteristics of a MOS (Metal/Oxide/Semiconductor) structure 2 having unknown capacitance $C_2$. The MOS structure 2 includes a silicon oxide film insulator having the thickness of less than 3 nm, e.g., 2 nm, in which direct tunnel leakage current flows. The capacitance structure 1 is a MOS structure including as an insulator a silicon oxide film having a thickness of 3 nm or more, e.g., 3.2 nm, in which direct tunnel leakage current cannot flow. The capacitance structure 1 is serially connectable to the MOS structure 2. The measuring section 3 is an LCR meter having an unprescribed structure.

In FIG. 1, each of $\Phi_{ms1}$ and $\Phi_{ms2}$ is a difference in work function of the capacitance structure 1 (e.g., about −1.0 V in a structure including an n+ Poly Si electrode and a P well (1E15 atm)); $C_1$ is the synthesis capacitance of capacitance $C_{1-1}$ of a silicon oxide film and capacitance $C_{1-2}$ of a silicon semiconductor of the capacitance structure 1; and $C_2$ is the synthesis capacitance of capacitance $C_{2-1}$ of a silicon oxide film and capacitance $C_{2-2}$ of a silicon semiconductor of the MOS structure 2 having unknown capacitance.

Figure 2:
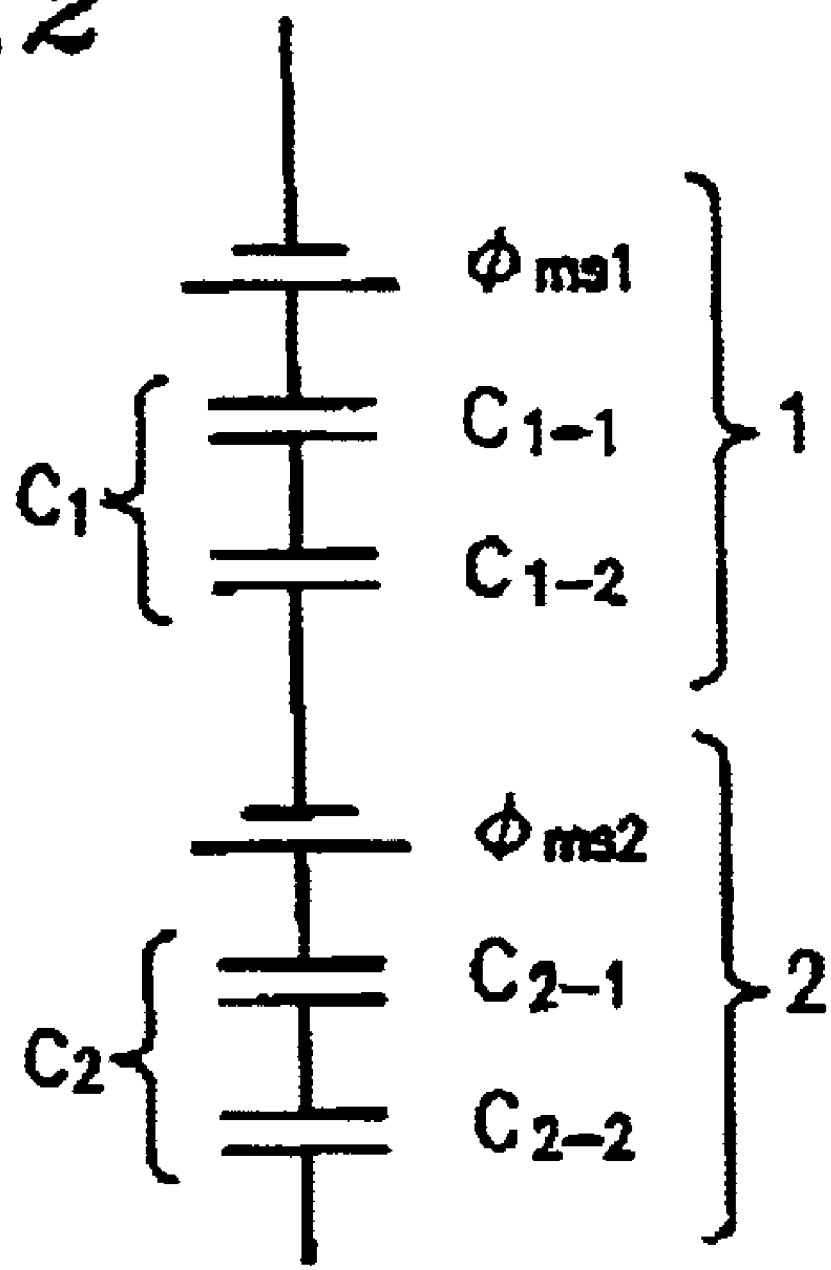
FIG. 2 illustrates an equivalent circuit including a capacitance structure 1 and a MOS structure 2 which are serially connected to each other.

FIG. 2 illustrates an equivalent circuit of the serially-connected capacitance structure 1 and MOS structure 2.

Figure 3:
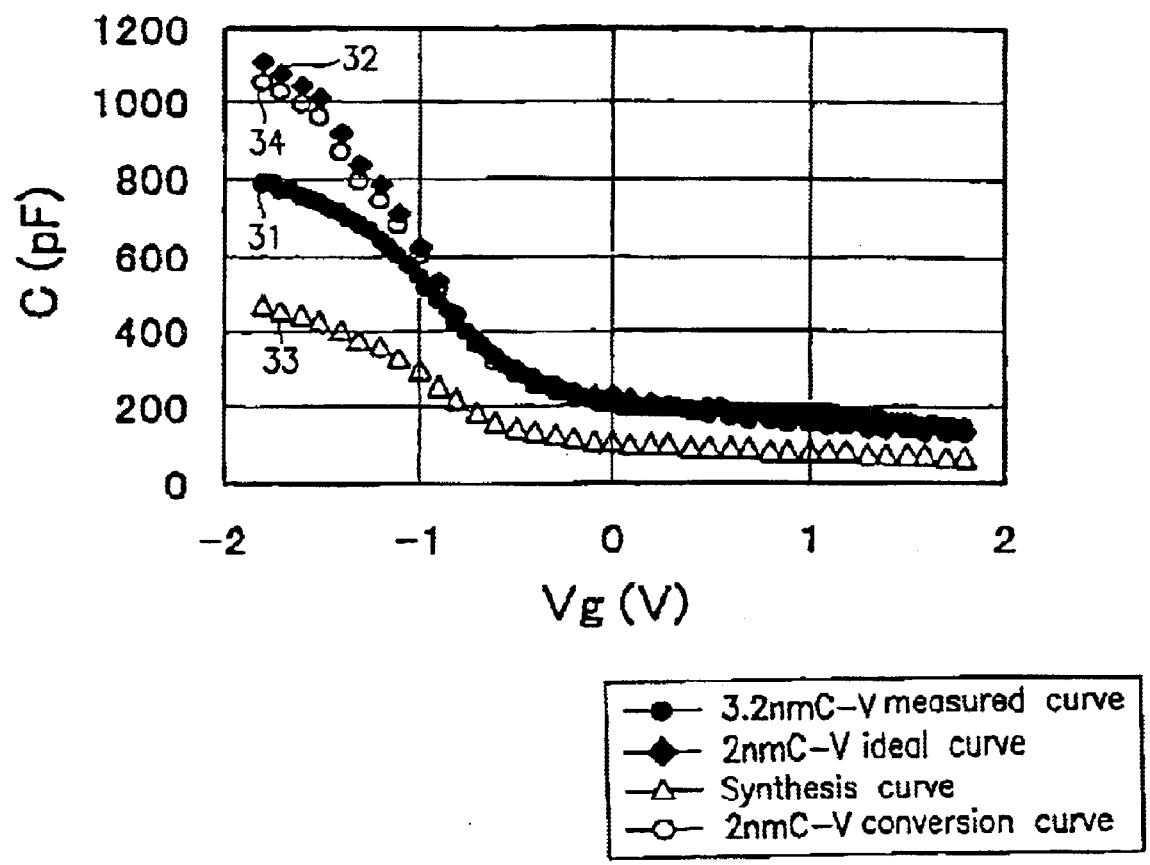
FIG. 3 illustrates C-V characteristics analyzed using the insulator capacitance analyzer 10 according to Example 1 of the present invention.

FIG. 3 illustrates C-V characteristics analyzed using the insulator capacitance analyzer 10 according to Example 1 of the present invention. In FIG. 3, reference numeral 33 denotes synthesis capacitance C of the capacitance structure 1 and the MOS structure 2 which is measured by the insulator capacitance analyzer 10. The synthesis capacitance C is represented using the capacitances $C_1$ and $C_2$ shown in FIG. 1 by the above-described Expression (1), which is reproduced below for convenience.

$$1/C = 1/C_1 + 1/C_2 \quad (1)$$

In Expression (1), respective values of the capacitance $C_1$ (capacitance of the capacitance structure 1 including as an insulator a silicon oxide film having a thickness of 3.2 nm) at various voltage levels are known and such values are plotted as a curve 31 (3.2 nm measured C-V curve) in FIG. 3.

The insulator capacitance analyzer 10 measures respective values of the synthesis capacitance C at various levels of voltage $V_g$. The measured values of the synthesis capacitance C are plotted as curve 33 in FIG. 3. Capacitance $C_2$ is calculated from the synthesis capacitance C (curve 33), the capacitance $C_1$ (curve 3 ), and Expression (1). The capacitance $C_2$ is shown as the 2 nm C-V conversion curve 34 in FIG. 3. The 2 nm C-V conversion curve 34 has a great resemblance to a 2 nm C-V ideal curve 32.

The work function difference $\Phi_{ms1}$ is used as described below. When a voltage generated in the LCR meter 3 (measuring section) is V, a voltage $V_2$ applied to the MOS structure 2 is represented as $V_2 = V - \Phi_{ms1}$. The synthesis capacitance $C_2$ of the MOS structure 2 having unknown capacitance is calculated from the synthesis capacitance C obtained at the voltage V, and the synthesis capacitance $C_2$ is plotted with respect to $V_2$, so that an accurate C-V curve can be produced.

In Example 1 of the present invention, the capacitance structure 1 includes a P+/P well structure and its work function difference $\Phi_{ms1}$ is 0.2 V. When the voltage generated in the LCR meter 3 is 2 V, a voltage of 1.8 V is applied to the MOS structure 2 having unknown capacitance. Accordingly, when the voltage generated in the LCR meter 3 is 2 V, the capacitance $C_2$ is calculated, and the calculated value is plotted with respect to 1.8 V in the C-V characteristic graph, so that the C-V characteristic curve of the MOS structure having unknown capacitance can be obtained.

It should be noted that the characteristic represented by 2 nm C-V ideal curve 32 shown in FIG. 3 is calculated based on a physical thickness of the insulator, and there is a slight difference between such a characteristic and the characteristic represented by the C-V conversion curve 34 calculated according to the present invention. The reason for this is that an impurity concentration in the electrode (Poly-Si) provided to the MOS structure 2 causes partial depletion in the electrode. When analyzing various characteristics, the capacitance data obtained by an actual measurement of an electrode characteristic as in Example 1 is more important than the capacitance data calculated based on the physical thickness.

Figure 8:
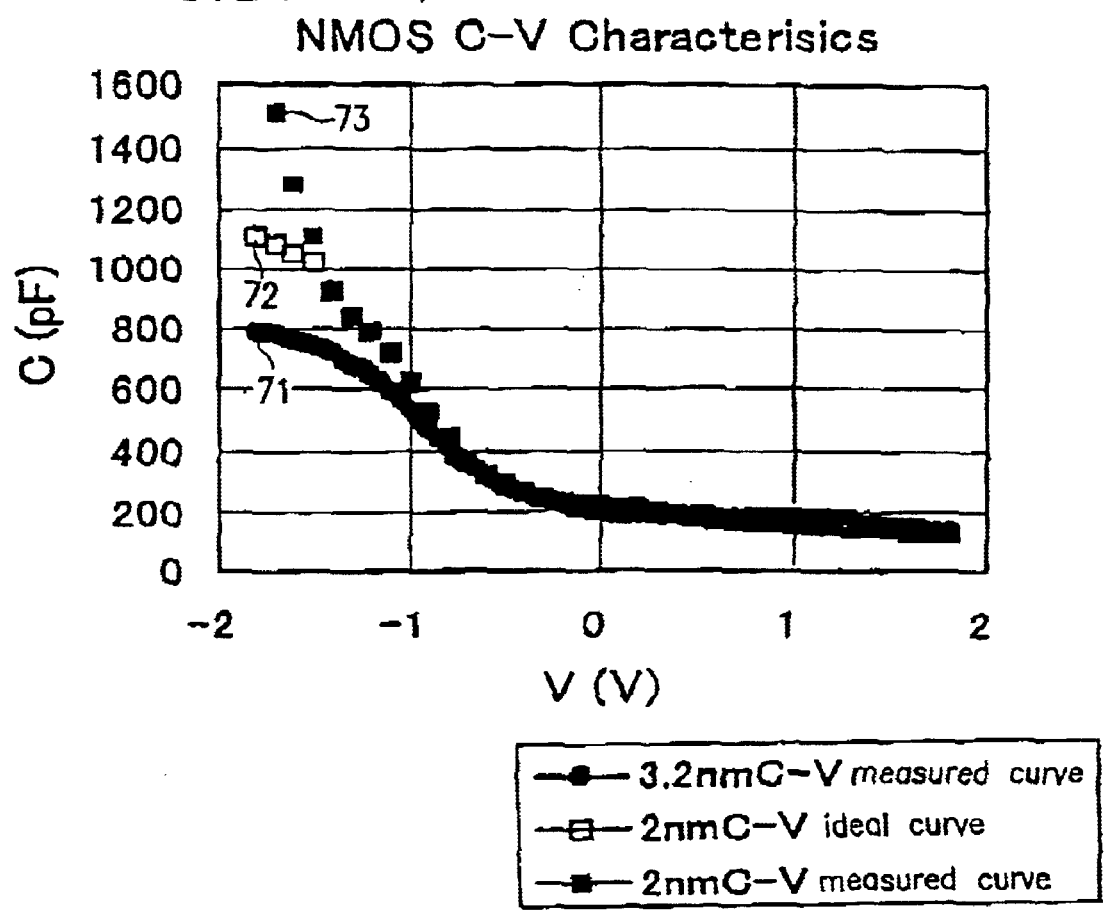
FIG. 8 is a graph showing C-V characteristics of an N-type MOS structure which are measured using a conventional C-V measuring device.
Figure 9:
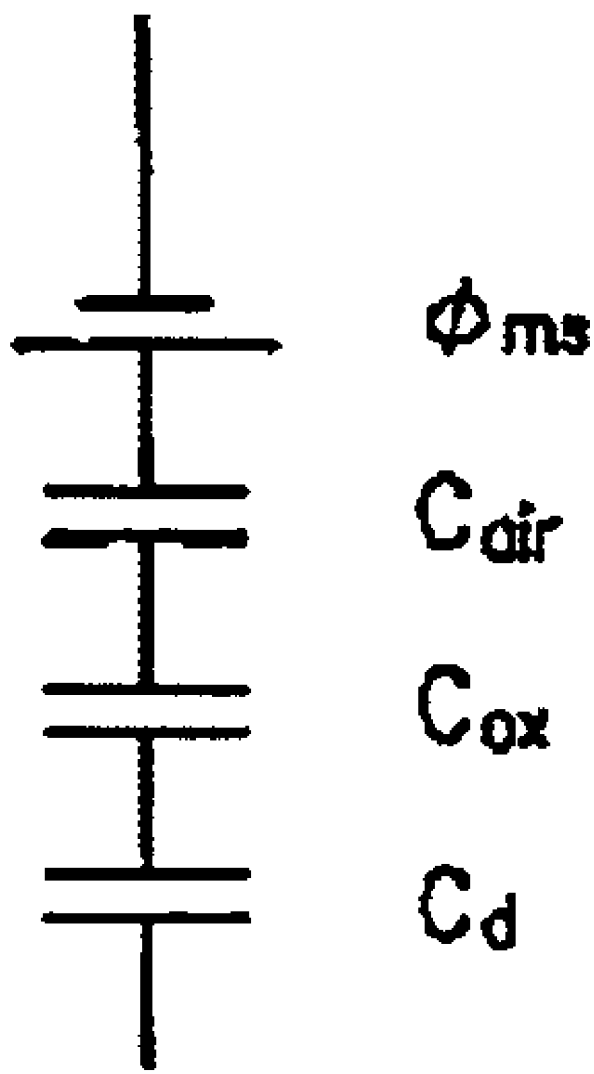
FIG. 9 is a schematic of an equivalent circuit diagram for explaining insulator capacitance measured using a non-contact-type C-V measuring device disclosed in Japanese Laid-Open Publication No. 6-112289.

As described above with reference to FIG. 8, in conventional C-V characteristic analysis, the capacitance structure 1 having a known capacitance is not provided, so that the C-V characteristics on an accumulation side (corresponding to a minus side in the C-V characteristics graph, i.e., −1 V to −1.5 V or lower) cannot be accurately analyzed due to direct tunnel leakage current.

As described above, the insulator capacitance analyzer 10 according to Example 1 of the present invention can accurately measure a C-V characteristic of the extremely thin insulator. Although it is not possible to analyze whether or not there is a boron ion punching-through the P+ gate electrode using conventional non-contact-type C-V measuring apparatuses (i.e., the device described in the above-described Japanese Laid-Open Publication No. 6-112289), it is possible to analyze whether or not there is a boron ion punching-through the P+ gate electrode by measuring the C-V characteristics of the P-type MOS structure.

Figure 4:
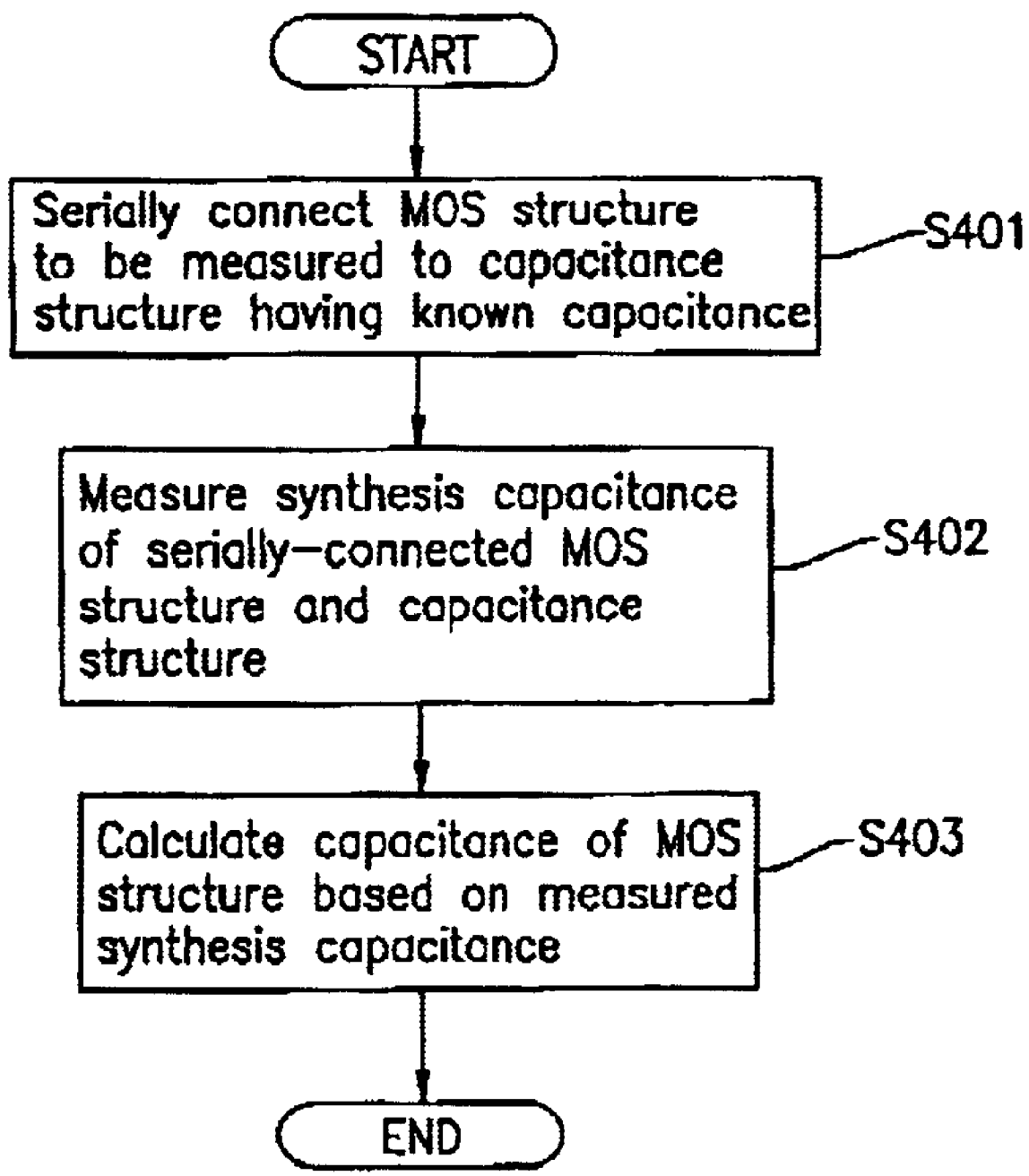
FIG. 4 is a flowchart of a method for analyzing C-V characteristics of the MOS structure 2 using the insulator capacitance analyzer 10.

FIG. 4 is a flowchart of a method for analyzing the C-V characteristics of the MOS structure 2 using the insulator capacitance analyzer 10.

Step S401: The MOS structure 2 to be measured is serially connected to the capacitance structure 1 having known capacitance.

Step S402: The synthesis capacitance C of the serially-connected MOS structure 2 and capacitance structure 1 is measured.

Step S403: The capacitance $C_2$ of the MOS structure 2 is calculated based on the measured synthesis capacitance C.

By repeating steps S401 through S403 at various levels of a voltage applied to the MOS structure 2, the C-V characteristics of the MOS structure 2 in a desired voltage range can be analyzed.

The capacitance structure 1 is not limited to a MOS structure having a silicon oxide film as an insulator. The capacitance structure 1 may be any MIS (Metal/Insulator/Semiconductor) structure including a MOS structure, a dielectric, or a capacitor so long as its capacitance is known. Alternatively, the capacitance structure 1 may be any combination of the MIS structure, the dielectric and the capacitor.

As a dielectric, an insulator, such as silicon oxide film, silicon nitride, or an aluminum oxide film may be used. It is preferable that when a dielectric is used as the insulator, the dielectric has a structure of a capacitor.

In the case where the capacitance structure 1 is a MOS structure having a silicon oxide film as an insulator, it is preferable that the thickness of the silicon oxide film is 3 nm or more. This is because direct tunnel leakage current is prevented from flowing through the capacitance structure 1. Moreover, in the case where the capacitance structure 1 is not a MOS structure having a silicon oxide film as an insulator, it is also preferable that the equivalent silicon oxide thickness of the capacitance structure 1 is 3 nm or more. This prevents excessive current resulting from direct tunnel current from flowing in the measuring section 3, so that an accurate capacitance measurement is made possible.

EXAMPLE 2

Figure 5:
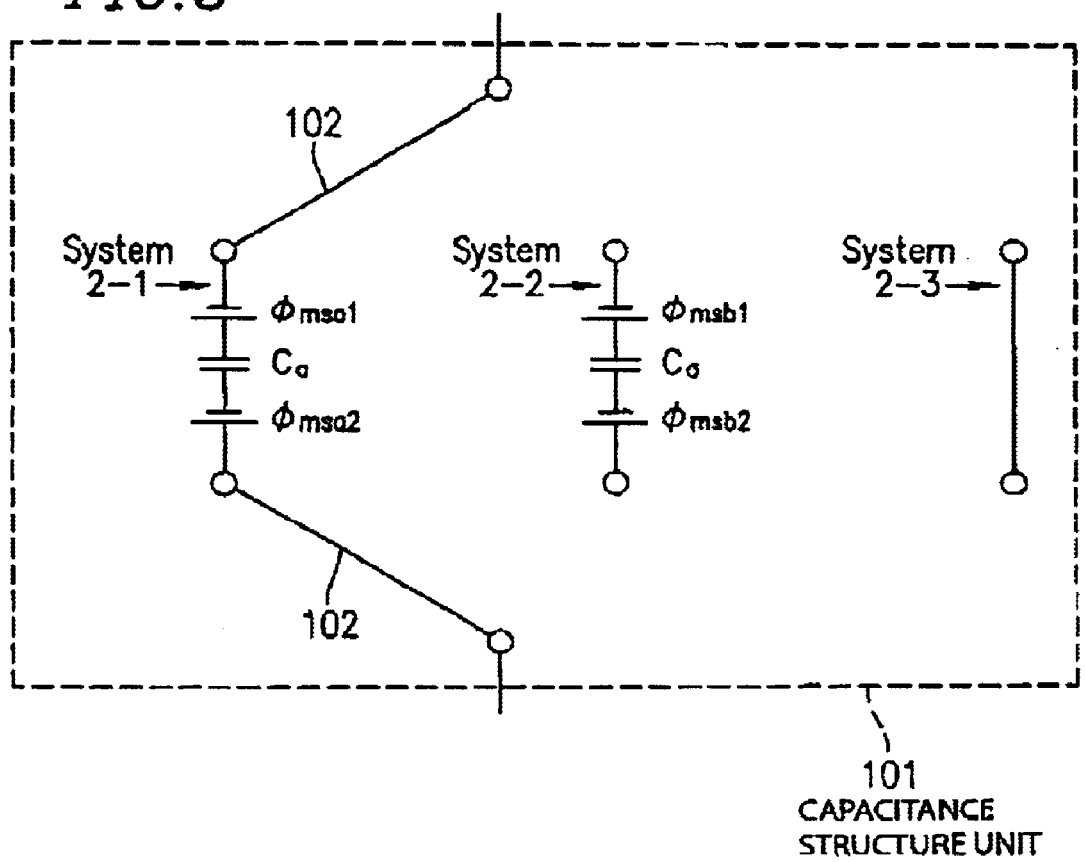
FIG. 5 illustrates an equivalent circuit included in a capacitance structure unit 101 used in the insulator capacitance analyzer according to Example 2 of the present invention.
Figure 6:
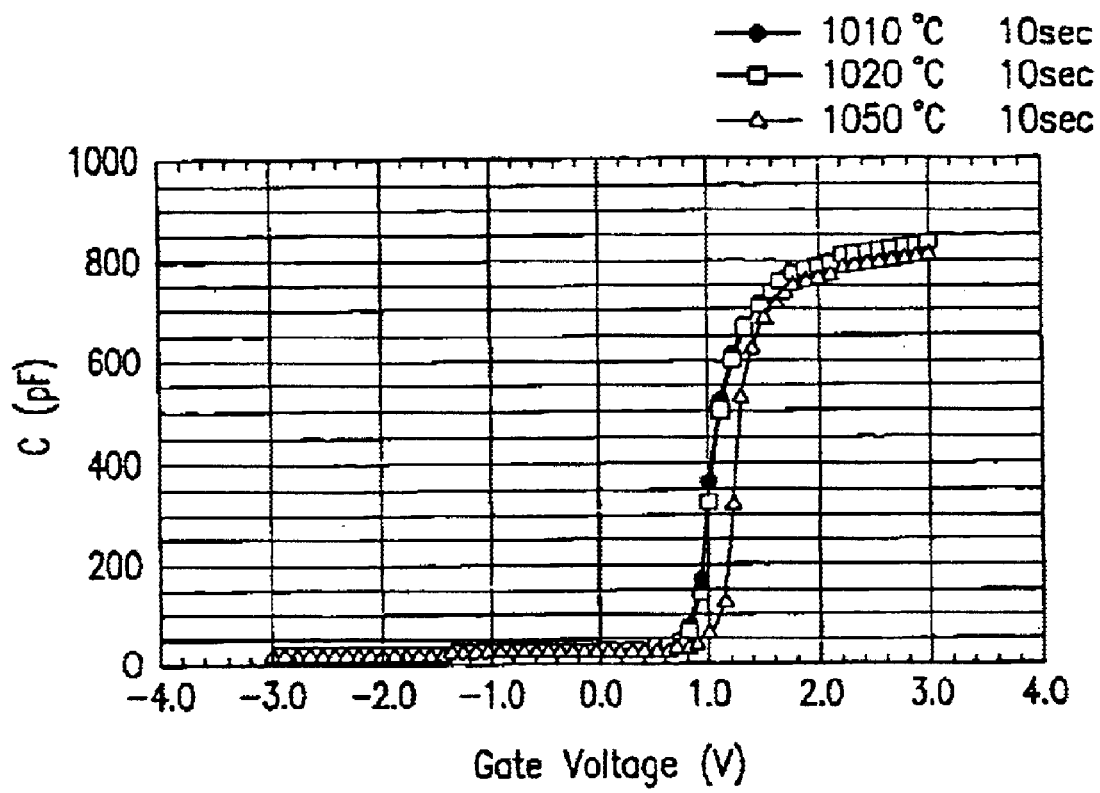
FIG. 6 is a graph illustrating punch-through of a boron ion in a P+ gate electrode caused by heat treatment after the formation of a MIS structure.
Figure 7:
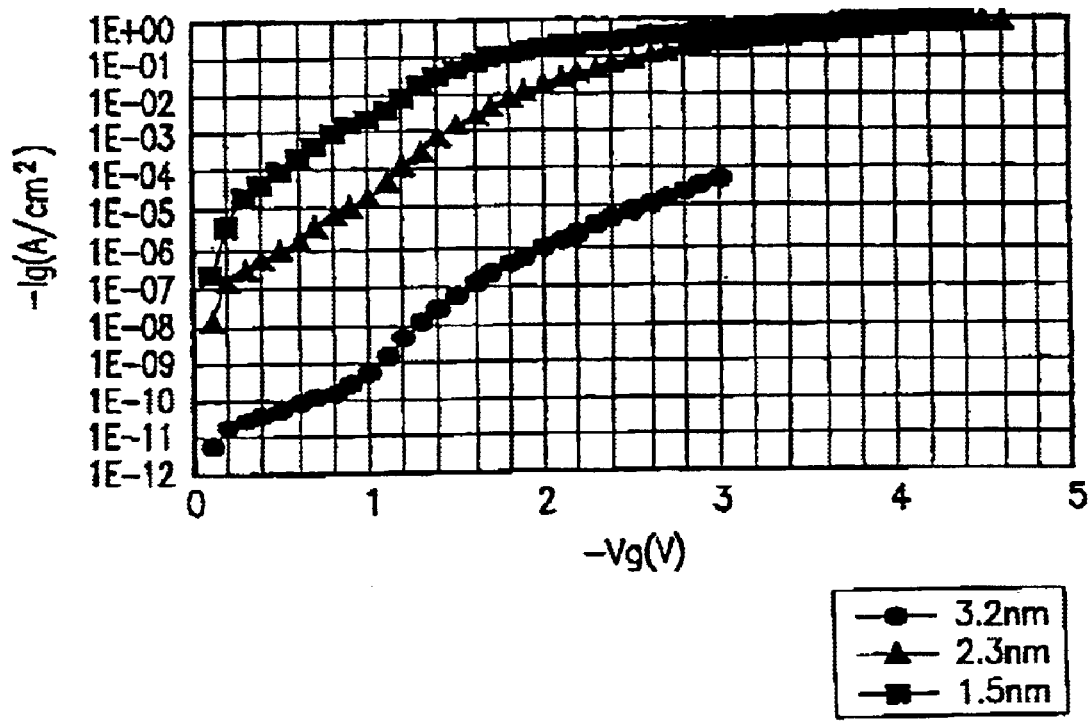
FIG. 7 is a graph illustrating I-V characteristics of an N-type MOS structure which includes a silicon oxide film insulator having a thickness of between about 1.5 nm and about 3.2 nm.

FIG. 5 illustrates an equivalent circuit included in a capacitance structure unit 101 used in an insulator capacitance analyzer according to Example 2 of the present invention. The capacitance structure unit 101 is used in place of the capacitance structure 1 of the insulator capacitance analyzer 10 (FIG. 1) according to the present invention. Except for this, a structure of the insulator capacitance analyzer according to Example 2 is similar to the insulator capacitance analyzer 10 according to Example 1.

The capacitance structure unit 101 includes system 2-1, system 2-2, system 2-3, and a switch 102. The system 2-1 is a capacitor which includes as an insulator a silicon oxide film having a thickness of 3 nm or more.(e.g., 3 nm) in which direct tunnel leakage current does not flow. The system 2-2 is a capacitor including as an insulator a silicon oxide film having a thickness of 3 nm or more (e.g., 5 nm) in which direct tunnel leakage current does not flow. The system 2-3 does not include a capacitor.

In FIG. 5, each of $\Phi_{msa1}$ and $\Phi_{msa2}$ is a work function difference of the capacitor of the system 2-1 and each of $\Phi_{msb1}$ and $\Phi_{msb2}$ is a work function difference of the capacitor of the system 2-2.

$C_a$ and $C_b$ are a capacitance of the capacitor of the system 2-1 and a capacitance of the capacitor of the system 2-2, respectively, and each of them has a known value. Here, the work function difference depends on metallic materials of electrodes sandwiching an insulator of the capacitor from above and below. In the case where the metallic materials of upper and lower electrodes are identical, the work function difference can be ignored. The capacitors of Example 2 are different from the MOS structure of the capacitance structure 1 according to Example 1 in that capacitance ($C_{1-2}$ shown in FIG. 2) of the depletion layer is not needed to be taken into account.

The switch 102 selects one of the systems 2-1, 2-2, and 2-3. When the system 2-3 is selected using the switch 102, as in the conventional case, the insulator capacitance can be measured without connecting a capacitor to the MOS structure to be measured. When either of the systems 2-1 or 2-2 is selected, a capacitor having known capacitance can be serially connected to the MOS structure having unknown capacitance. In this manner, a capacitor having desired capacitance can be connected to the MOS structure to be measured.

The systems 2-1 and 2-2 may have equivalent capacitance.

In order to improve measurement accuracy, it is preferable that an insulator (e.g., silicon oxide film) used as the capacitor of each of the systems 2-1 and 2-2 is as thin as possible. However, in order not to allow direct tunnel leakage current to flow through the capacitors of the systems 2-1 and 2-2, it is preferable that the thickness of the insulator is 3 nm or more. In consideration of the tradeoff between the measurement accuracy and leakage current, it is most preferable that the thickness of the insulator used as a capacitor of each of the systems 2-1 and 2-2 is approximately 3 nm. However, such a thin silicon oxide film readily deteriorates due to stress. For example, when a capacitor including a 3 nm-thick insulator is used as a capacitance structure having known capacitance, electrical stress is accumulated in the insulator, so that an electrical breakdown of the insulator is caused after capacitance measurements are performed approximately 1000 times. Accordingly, when the systems 2-1 and 2-2 have equivalent capacitance, one of them can be used as a reserve capacitor. When measurements are performed more than a prescribed number of measurements using a preselected capacitor, the reserve capacitor can be selected.

As in the case of the capacitance structure 1 according to Example 1, each of the systems 2-1 and 2-2 may be any capacitance structure so long as its capacitance is known. For example, either or both of the systems 2-1 and 2-2 may be a MOS structure. The number of capacitance structures which are included in the capacitance structure unit and can be selected by the switch 102 is not limited to two. Moreover, it is not indispensable that the capacitance structure unit 101 includes the system 2-3 to which a capacitor is not provided.

In Example 2 of the present invention, although the capacitors (capacitance structures) can be selected by a switch, the capacitors may be individually removable from a body of the insulator capacitance analyzer.

In Examples 1 and 2, cases where capacitance of the MOS structure 2 is analyzed using the insulator capacitance analyzer 10 have been described. However, the insulator capacitance analyzer 10 can analyze the capacitance of any type of MIS structure including a MOS structure.

The present invention makes it possible to measure a synthesis capacitance C of a MIS structure having unknown capacitance ($C_2$) to which a capacitance structure having known capacitance ($C_1$) is serially connected. Accordingly, the unknown capacitance ($C_2$) is consequentially calculated from the synthesis capacitance C. Thus, according to the present invention, it is possible to analyze C-V characteristics of a MIS structure which cannot be analyzed by a conventional method directly measuring the unknown capacitance ($C_2$).

Especially, even when the MIS structure to be measured has a thin insulator, so that direct tunnel leakage current flows in the MIS structure to be measured, so long as the capacitance structure is configured so as not to allow the direct tunnel leakage current to flow through the capacitance structure (i.e., so long as the capacitance structure is dominated by F-N tunnel leakage current), excessive leakage current can be prevented from flowing in the insulator capacitance analyzer, and thus the synthesis capacitance C can be accurately measured.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An insulator capacitance analyzer for analyzing C-V characteristics of a first MIS structure having unknown capacitance, comprising:

a capacitance structure having known capacitance and configured so as to be serially connectable to the first MIS structure;

a measuring section for measuring synthesis capacitance of the serially-connected first MIS structure and capacitance structure;

a plurality of capacitance structures each having known capacitance and configured so as to be serially connectable to the first MIS structure; and a switch for selecting one of the plurality of capacitance structures as the capacitance structure.

2. An insulator capacitance analyzer for analyzing C-V characteristics of a first MIS (Metal/Insulator/Semiconductor) structure, comprising:

a capacitance structure having a known capacitance and serially connected to the first MIS structure;

a measuring section for measuring a synthesis capacitance of the serially-connected first MIS structure and the capacitance structure; and a plurality of capacitance structures each having known capacitance and configured so as to be serially connectable to the first MIS structure; and a switch for selecting one of the plurality of capacitance structures as the capacitance structure.

* * * * *